US010043717B2

(12) United States Patent
Arai et al.

(10) Patent No.: US 10,043,717 B2
(45) Date of Patent: Aug. 7, 2018

(54) ELECTRONIC DEVICE

(71) Applicant: NIHON DEMPA KOGYO CO., LTD., Tokyo (JP)

(72) Inventors: Junichi Arai, Saitama (JP); Masakazu Nishiwaki, Saitama (JP); Daisaku Nagata, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/613,276

(22) Filed: Jun. 5, 2017

(65) Prior Publication Data

US 2017/0358499 A1    Dec. 14, 2017

(30) Foreign Application Priority Data

Jun. 8, 2016    (JP) .................. 2016-114737

(51) Int. Cl.
| H05K 7/00 | (2006.01) |
| H05K 5/00 | (2006.01) |
| H01L 21/8238 | (2006.01) |
| H01L 23/522 | (2006.01) |
| H01L 23/00 | (2006.01) |
| H01L 27/092 | (2006.01) |
| H01L 29/10 | (2006.01) |

(52) U.S. Cl.
CPC ........... *H01L 21/823807* (2013.01); *H01L 21/823842* (2013.01); *H01L 23/5227* (2013.01); *H01L 24/06* (2013.01); *H01L 27/092* (2013.01); *H01L 29/1054* (2013.01)

(58) Field of Classification Search
CPC ........................................... H05K 3/34
USPC ........................................ 361/679.01
See application file for complete search history.

(56) References Cited

U.S. PATENT DOCUMENTS

| 6,282,091 B1 * | 8/2001 | Horng ............... G06F 1/20 165/121 |
| 2002/0043608 A1 * | 4/2002 | Nakata ............... F16F 1/025 248/560 |
| 2008/0056844 A1 * | 3/2008 | Aukzemas ........... F16B 5/0266 411/353 |

FOREIGN PATENT DOCUMENTS

JP    2008085744    4/2008

\* cited by examiner

*Primary Examiner* — Jerry Wu
(74) *Attorney, Agent, or Firm* — JCIPRNET

(57) ABSTRACT

An electronic device includes at least two boards and support pillars. The at least two boards include hole portions. The support pillars inserted into the hole portions such that the at least two boards are held mutually separated. The hole portions include tapered surfaces that incline toward center portions of the hole portions from a surface on a side from which the support pillars of the boards are inserted.

2 Claims, 9 Drawing Sheets

ELECTRONIC DEVICE

CROSS-REFERENCE TO RELATED APPLICATIONS

This application is based on and claims priority under 35 U.S.C. § 119 to Japanese Patent Application No. 2016-114737, filed on Jun. 8, 2016, the entire content of which is incorporated herein by reference.

TECHNICAL FIELD

This disclosure relates to an electronic device.

DESCRIPTION OF THE RELATED ART

Electronic equipment used for computers, mobile terminals, and base stations includes many electronic devices. As the electronic device, there are known a crystal unit and an oscillator that include a piezoelectric vibrating piece, such as a quartz crystal piece. As such an electronic device, there is known a configuration in which electronic components are mounted on an electronic circuit board, and the electronic circuit board is held separated from a base board with support pillars that are raised from the base board (see Japanese Unexamined Patent Application Publication No. 2008-85744, for example). In the electronic device having this configuration, the boards are relatively positioned and bonded via the support pillars by inserting distal ends of the support pillars raised from one board into hole portions of the other board.

However, in the case where there is the distal end of the support pillar that is off of a hole portion position when the boards to be bonded are positioned with one another, a position of such support pillar has to be finely adjusted, and this causes a labor and a cost of the adjustment. For such problem, setting a larger diameter for the hole portion may be a conceivable solution. However, in this case, relatively positioning the boards with accuracy is difficult, and this causes a problem that an outside dimension of the electronic device varies depending on the product.

A need thus exists for an electronic device which is not susceptible to the drawback mentioned above.

SUMMARY

According to this disclosure, there is provided an electronic device. The electronic device includes at least two boards and support pillars. The at least two boards include hole portions. The support pillars inserted into the hole portions such that the at least two boards are held mutually separated. The hole portions include tapered surfaces that incline toward center portions of the hole portions from a surface on a side from which the support pillars of the boards are inserted.

BRIEF DESCRIPTION OF THE DRAWINGS

The foregoing and additional features and characteristics of this disclosure will become more apparent from the following detailed description considered with reference to the accompanying drawings, wherein:

FIG. 1A is a plan view, and FIG. 1B is a cross-sectional view taken along a line IB-IB in FIG. 1A;

FIG. 6A is a cross-sectional view, and FIG. 6B is a cross-sectional view of a main part in FIG. 6A;

DETAILED DESCRIPTION

Figure 1A:
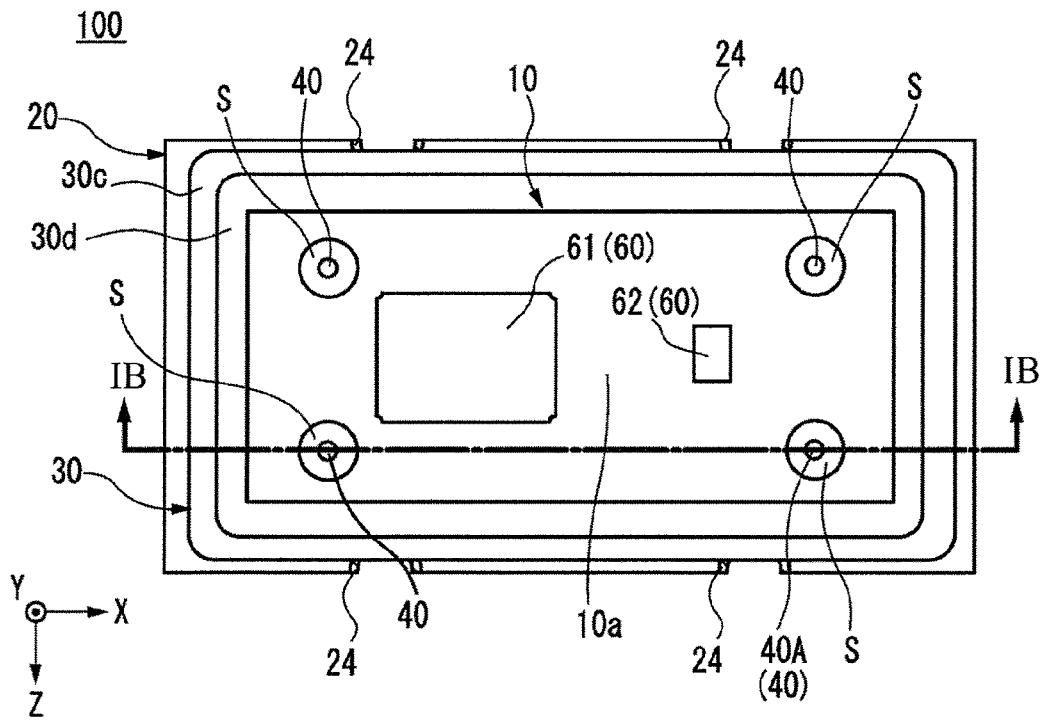
FIG. 1A and FIG. 1B illustrate an exemplary electronic device according to a first embodiment.

Hereinafter, embodiments of this disclosure will be described with reference to the drawings. It will be understood that the scope of the disclosure is not limited to the described embodiments. A scale of an expressed drawing is adjusted to explain the following embodiments. For example, a part of a drawing is enlarged or stressed as required when it is described. In the cross-sectional views, board areas and metal film areas are illustrated with hatching patterns. Each of the following drawings uses an XYZ coordinate system to describe directions in the drawings. In this XYZ coordinate system, a plane parallel to a top surface of an electronic device is assumed to be an XZ-plane. A direction perpendicular to the XZ-plane (thickness direction of the electronic device) is indicated as a Y-direction. It is described that a directions pointed by an arrow in the drawings is assumed to be a + direction in each of X, Y, and Z-directions. The direction opposite of the arrow direction is assumed to be a − direction.

First Embodiment

Figure 1B:
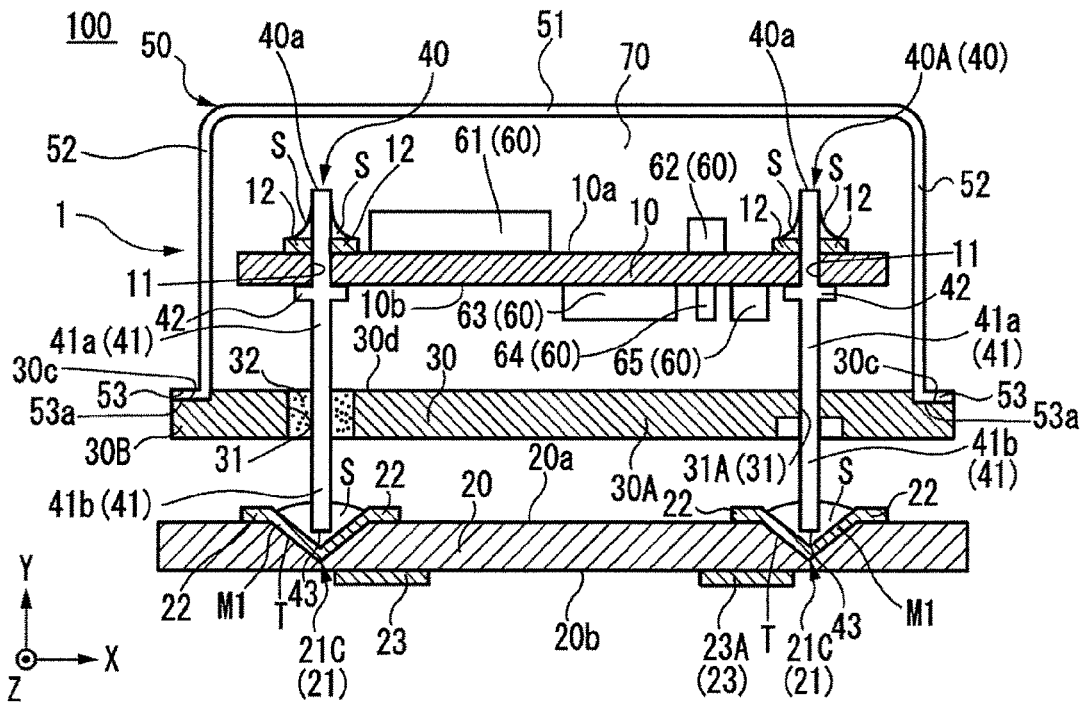

An example of an electronic device 100 according to an embodiment will be described using FIG. 1A and FIG. 1B. FIG. 1A is a plan view of the electronic device 100. FIG. 1B is a cross-sectional view taken along a line IB-IB in FIG. 1A. In FIG. 1A, a cover 50, which will be described later, is transparently illustrated. The electronic device 100 has a configuration of so-called surface mount type (Surface Mount Device: SMD) and is an oven controlled crystal oscillator (OCXO) that keeps an ambient temperature of a crystal resonator at constant. The same applies to other embodiments described later. The electronic device 100 includes an electronic device main body 1 and a second board (base plate) 20 as illustrated in FIG. 1A and FIG. 1B. The electronic device main body 1 includes a first board (base plate) 10.

The electronic device main body 1 is disposed on a +Y-side of the second board 20 and bonded to the second board 20. The electronic device main body 1 has a configuration of so-called pin-type device (Through Hole Mounting Device: THD) and is configured to be mountable with pin-shaped lead portions 41a inserted into a printed board of, for example, an electronic product. The electronic device main body 1 includes the first board 10, a third board (base plate) 30, support pillars 40, and the cover 50.

The first board 10 is formed in a rectangular-plate shape. A longitudinal direction of the first board 10 is parallel with the X-direction. A short side direction of the first board 10 is parallel with the Z-direction. As the first board 10, a glass epoxy board is employed. However, the first board 10 is not limited to the glass epoxy board, and a ceramic board, a glass board, a mold resin board, or similar board may be employed. On a front surface (a surface on the +Y-side) 10a and a back surface (a surface on a −Y-side) 10b of the first board 10, electronic components 60, such as a piezoelectric device and a semiconductor device are mounted. On a side of the front surface 10a of the first board 10, for example, a crystal resonator 61 and an oscillator circuit 62 are mounted. On a side of the back surface 10b, for example, a heater 63, a temperature sensor 64, and a temperature control circuit 65 are mounted. These electronic components 60 are connected to circuit wiring (not illustrated) disposed in the first board 10. These electronic components 60 may be mounted only on any one of the front surface 10a side and the back surface 10b side of the first board 10.

The first board 10 includes hole portions 11 at, for example, four corner portions. The hole portions 11 are through holes passing through the first board 10 in the Y-direction and each formed in a cylindrical shape having an identical shape and dimension. In the hole portions 11, the respective support pillars 40 are inserted. The first board 10 is held separated from the third board 30 with the support pillars 40 raised from the third board 30. The back surface 10b of the first board 10 faces surfaces 30d and 30c of the third board 30 on the +Y-side. The first board 10 is disposed parallel with the third board 30.

In regions that surround the hole portions 11 on the front surface 10a of the first board 10, respective connection electrodes 12 are formed. The connection electrode 12 is a metal film made of copper plating. The metal film of the connection electrode 12 may be gold, argentum, or similar material, instead of copper. The connection electrode 12 may be formed by a method such as printing via a metal mask, sputtering, and vacuum evaporation, instead of plating. The connection electrodes 12 are connected to circuit wiring (not illustrated) of the first board 10.

The third board 30 is formed in a rectangular-plate shape using a metallic material having a conductive property, such as iron and kovar (alloy of iron, nickel, and cobalt). The third board 30 may be formed of resin, ceramic, glass, or similar material, instead of metal. A longitudinal direction of the third board 30 is parallel with the X-direction. A short side direction of the third board 30 is parallel with the Z-direction. The third board 30 is configured to include a central portion 30A and a surrounding edge portion 30B. The central portion 30A has a surface on the +Y-side projecting in the +Y-side with respect to a peripheral portion. The surrounding edge portion 30B surrounds the central portion 30A. The surface 30c of the surrounding edge portion 30B on the +Y-side is a bonding surface on which the cover 50 is bonded. The surface 30d of the central portion 30A on the +Y-side and the bonding surface 30c are both parallel with the XZ-plane.

The third board 30 (the central portion 30A) includes four through holes 31 that pass through the third board 30 in the thickness direction (the Y-direction). The through holes 31 are disposed at respective four corner portions of the central portion 30A and are formed such that the support pillars 40 are insertable. A through hole 31A on the +X-side and +Z-side among these four through holes 31 is airtightly sealed by welding in a state where a support pillar 40A is inserted. This secures and electrically connects the support pillar 40A to the third board 30. The support pillar 40A has a configuration of so-called ground pin and is connected to the ground. In view of this, the support pillar 40A is electrically connected to the cover 50 via the third board 30, thus the electronic components 60 are electromagnetically shielded. The other three through holes 31 among the above-described four through holes 31 are filled with a sealing material 32 after the support pillars 40 are inserted. This hermetically seals the through holes 31. This hermetic sealing secures the support pillars 40 to the third board 30. As the sealing material 32, a material having a non-conductive property, such as a glass material and a resin material, is used. This prevents the support pillars 40 and the third board 30 from electrically connected.

For example, four support pillars 40 are disposed in the electronic device main body 1. The support pillar 40 includes a shaft portion 41 linearly extending in the Y-direction. While the shaft portion 41 is in a columnar shape, the shape of the shaft portion 41 is not limited to the columnar shape, and may be in a prismatic shape or similar shape. The shaft portion 41 passes through the third board 30 in the Y-direction. The inner lead portions 41a of the shaft portions 41 extend in a +Y-direction from the central portion 30A of the third board 30. The inner lead portion 41a includes a flange portion 42 that projects from a side surface (a peripheral surface) of the shaft portion 41 in a direction perpendicular to an axial direction (a direction parallel with the XZ-plane). The flange portion 42 serves as a stopper that is locked with the back surface 10b of the first board 10 when the support pillar 40 is inserted into the hole portion 11 from the back surface 10b side of the first board 10. The flange portion 42 is formed in, for example, a disk shape whose outer edge diameter is set to be large compared with a diameter of the hole portion 11. The flange portion 42 being locked with the back surface 10b arranges the first board 10 in a state of being separated from the third board 30 and parallel with the XZ-plane. The support pillar 40 also serves as a lead to electrically connect the electronic device main body 1 to the second board 20. As the support pillar 40, a metallic material having a conductive property, such as alloy of copper, iron, and nickel, kovar, and stainless steel, is used. Lead portions 41b of the shaft portions 41 of the support pillars 40 extend in a −Y-direction from the third board 30. A length of the lead portion 41b is adjusted to cause a height (a length in the Y-direction) of the electronic device 100 to be a predetermined dimension.

A distal end 40a of the support pillar 40 on the +Y-side is in a state of being inserted into the hole portion 11 and projecting in the +Y-direction from the front surface 10a of the first board 10. In this state, the support pillar 40 is bonded to the first board 10 on the front surface 10a side of the first board 10 using a solder S. This secures the support pillar 40 to a predetermined position in the first board 10 and electrically connects the support pillar 40 to the connection electrode 12 via the solder S. Bonding of the support pillar 40 and the first board 10 and electrical connection of the support pillar 40 and the connection electrode 12 are not limited to using the solder S, but a conductive adhesive or similar material may be used instead of the solder.

The cover 50 includes a plane surface portion (a surface on the +Y-side) 51, a tubular trunk portion 52 extending in the −Y-direction from a peripheral area of the plane surface portion 51, and a collar portion 53 projecting outward from an end portion of the trunk portion 52 on the −Y-side. The trunk portion 52 is formed to be fittable to the surrounding edge portion 30B of the third board 30. On a surface on the −Y-side of the collar portion 53, a bonding surface 53a that is bonded to the bonding surface 30c of the third board 30 is formed. The bonding surface 30c of the third board 30 and the bonding surface 53a of the cover 50 are bonded by resistance welding, such as seam welding and spot welding.

Bonding the third board 30 and the cover 50 forms a housing space 70. The housing space 70 houses the first board 10 and may be configured to contain an inert gas atmosphere, such as a vacuum atmosphere and a nitrogen gas. The third board 30 and the cover 50 may be bonded using various kinds of bonding materials instead of the weld bonding.

The second board 20 is disposed on the −Y-side with respect to the electronic device main body 1. The second board 20 is mounted on a printed board (not illustrated) in the electronic product in which the electronic device 100 is included. The second board 20 includes external connection terminals 23 that are bonded to such printed board. The second board 20 is formed approximately in a rectangular shape. A longitudinal direction of the second board 20 is parallel with the X-direction. A short side direction of the second board 20 is parallel with the Z-direction. A front surface (a surface on the +Y-side) 20a and a back surface (a surface on the −Y-side) 20b of the second board 20 are parallel with the XZ-plane. For the second board 20, similar to the above-described first board 10, a glass epoxy board is used, but this should not be construed in a limiting sense, and a ceramic board or similar board may be used. The second board 20 may be formed of a material identical to that of the first board 10 or may use a material different from that of the first board 10. The second board 20 may include the electronic components 60 on the front surface. In this case, the second board 20 includes a wiring circuit that is electrically connected to the electronic components 60.

The front surface 20a of the second board 20 includes hole portions 21. The hole portions 21 are disposed at positions corresponding to the lead portions 41b and located at respective four corner portions on the front surface 20a of the second board 20. The hole portion 21 is formed such that a distal end (an end portion on the −Y-side) 43 of the lead portion 41b is insertable.

Figure 2:
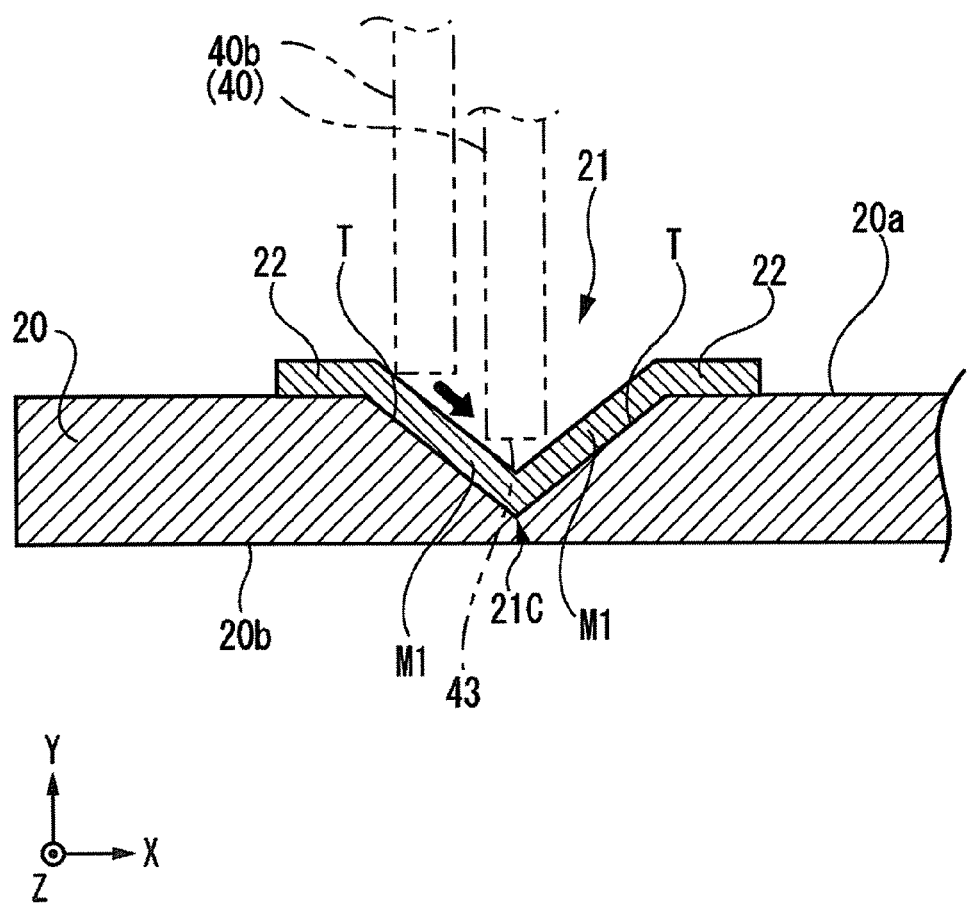
FIG. 2 is a cross-sectional view of a main part of the electronic device illustrated in FIG. 1A and FIG. 1B.

FIG. 2 is a cross-sectional view of a main part illustrating an example of the electronic device 100. FIG. 2 illustrates a part including the hole portion 21 in the second board 20 on the −X-side and +Z-side. The following describes a configuration of this hole portion 21, and the same applies to the other three hole portions 21. As illustrated in FIG. 2, the hole portion 21 has a configuration of a tapered surface T that inclines toward a center portion 21C from the front surface 20a of the second board 20. The hole portion 21 does not pass through the second board 20 but is formed so as to gradually decrease its diameter from a side of the front surface 20a to a side of the back surface 20b. An outer edge shape of the tapered surface T (a surface of the hole portion 21) viewed from the Y-direction is formed to be, for example, a perfect circular shape. An inclination angle of the tapered surface T with respect to the XZ-plane is constant. The tapered surface T has a symmetrical shape with respect to a straight line that extends in the Y-direction and passes through a center of the hole portion 21. In view of this, a cross-sectional shape of the hole portion 21 taken along an XY-plane is approximately an isosceles triangle shape that has a bottom parallel with the XZ-plane and an apex located on the −Y-side. While such tapered surface T is formed by drilling using a drill whose distal end angle is configured to be an angle identical to the inclination angle of the tapered surface T, the tapered surface T may be formed by another mechanical processing, laser processing, chemical processing, or similar processing. The tapered surface T is not limited to the above-described configuration, and the tapered surface T may have the outer edge shape viewed from the Y-direction in an oval-like shape or an elliptical shape and may be formed so as to vary the inclination angle with respect to the XZ-plane. Modification matters regarding the above-described tapered surface T are similarly applicable to other embodiments and modifications.

The hole portion 21 includes a first metal film M1 over a whole internal surface. The first metal film M1 has a configuration of a metal film similar to that of the above-described connection electrode 12 of the first board 10. The first metal film M1 is formed using a method similar to a film formation method of the above-described connection electrode 12 after the hole portion 21 is formed in the second board 20.

On the front surface 20a of the second board 20, respective connection electrodes 22 are formed in the regions surrounding the hole portions 21. The connection electrode 22 has a configuration of a metal film similar to the first metal film M1 and is integrally formed with the first metal film M1.

Referring again to FIG. 1A and FIG. 1B, in the hole portions 21 of the second board 20, the respective distal ends 43 of the lead portions 41b of the support pillars 40 are inserted. The distal ends 43 of the lead portions 41b is positioned above the center portions 21C in the hole portion 21. This accurately positions the electronic device main body 1 and the second board 20 with one another. In this state, the support pillar 40 is bonded to the second board 20 with the solder S and is electrically connected to the connection electrode 22 and the first metal film M1. Bonding of the support pillar 40 and the second board 20 is not limited to using the solder, but the conductive adhesive or similar material may be used instead of the solder.

For example, four external connection terminals 23 are disposed on the back surface 20b of the second board 20. The external connection terminal 23 has a configuration of a metal film similar to that of the connection electrode 12 of the above-described first board 10. The external connection terminal 23 is used for, for example, supplying power source, outputting, and ground connection. Among these, an external connection terminal 23A on the +X-side and +Z-side is a ground connection terminal. The external connection terminals 23 are electrically connected to the connection electrodes 12 via respective extraction electrodes. This extraction electrode is each configured to include a castellation electrode 24 formed at a side surface of the second board 20 on the +Z-side or the −Z-side. Instead of this, the extraction electrode may, for example, be configured to include a through electrode formed by filling a conductive paste in a through hole passing through the second board 20 in the Y-direction.

Figure 3:
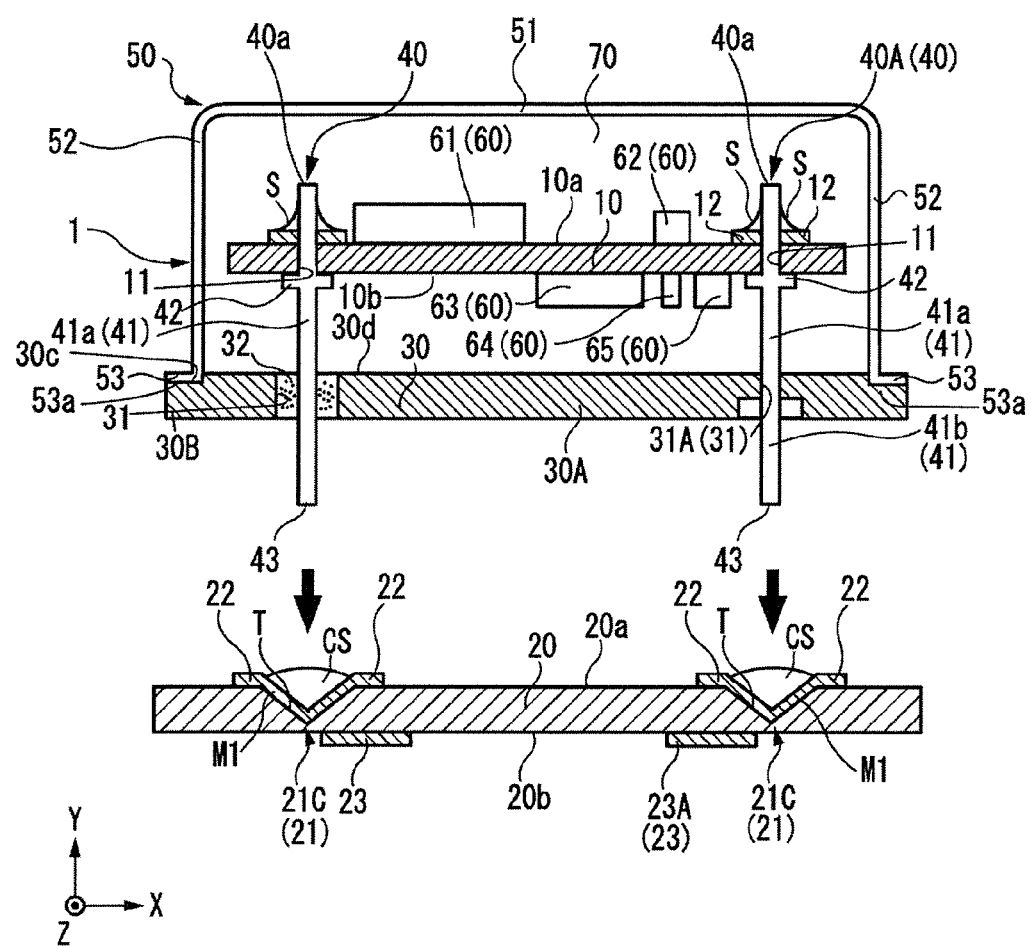
FIG. 3 is a drawing illustrating a part of a manufacturing process for the electronic device illustrated in FIG. 1A and FIG. 1B.

Next, an exemplary manufacturing process for the electronic device 100 will be described. FIG. 3 is a drawing illustrating a part of manufacturing process for the electronic device 100. The electronic device 100 is manufactured by a process in which the electronic device main body 1 and the second board 20 are prepared first, and subsequently the distal ends 43 of the lead portions 41b (the support pillars 40) of the electronic device main body 1 are bonded in a state of being inserted into the hole portions 21 of the second board 20 as illustrated in FIG. 3. Almost the same applies to the process in which the conductive adhesive is used instead of the solder S for bonding the electronic device main body 1 and the second board 20.

In the above-described process, first, the hole portions 21 of the second board 20 are applied with a pastelike cream solder CS. The application of the cream solder CS is performed by printing using, for example, a metal mask. Next, the electronic device main body 1 and the second board 20 are positioned with one another. In this respect, viewing from the Y-direction, the distal end 43 of the support pillar 40 is arranged so as to be included in an opening region of the hole portion 21 into which the distal end 43 is inserted in a state where the front surface 20a of the second board 20 faces a side of the electronic device main body 1.

Subsequently, in this state, the electronic device main body 1 and the second board 20 are relatively brought close in the Y-direction to insert the distal ends 43 of the lead portions 41b into the hole portions 21. In this respect, the electronic device main body 1 and the second board 20 may be brought close to one another by using a weight of one of the electronic device main body 1 or the second board 20 that is placed above the other, or one of the electronic device main body 1 or the second board 20 may be pressed against the other. In this respect, since the hole portion 21 is a non-through hole, the applied cream solder CS does not flow out to the back surface 20b side of the second board 20 via the hole portion 21. In the case where the inserted distal end 43 of the support pillar 40 abuts on the tapered surface T, the tapered surface T serves as a stopper that restricts a move of the support pillar 40 in the −Y-direction.

As described above, the diameter of the hole portion 21 is set to be larger in the front surface 20a side than in an internal side of the second board 20. That is, the opening region of the hole portion 21 viewed from the Y-direction is formed to be large in the front surface 20a side compared with the center portion 21C of the hole portion 21. Accordingly, even in the case where the distal end 43 of the lead portion 41b is off of the center portion 21C of the hole portion 21 when it is viewed from the Y-direction in a state where the electronic device main body 1 and the second board 20 are positioned with one another, the distal end 43 can be inserted into the hole portion 21 as it is without a need for a fine adjustment of the position of the distal end 43 insofar as the distal end 43 is included within the opening region on the front surface 20a side. Accordingly, such configuration of the hole portion 21 facilitates an operation of inserting the distal end 43 into the hole portion 21, and eventually it is possible to automate such inserting operation by using a machine, such as a chip mounter. Thus, the manufacturing cost of the electronic device 100 can be reduced.

Subsequently to the above-described inserting process, the cream solder CS is heated for reflow. In this respect, in the case where there is the support pillar 40 that is off of the center portion 21C viewing from the Y-direction, the reflow may be performed after pushing this support pillar 40 further inward of the hole portion 21, or the reflow may be performed in the state where the support pillar 40 is off of the center portion 21C.

In the case where the support pillar 40 (40b) that is off of the center portion 21C is pushed inward of the hole portion 21, the distal end 43 of the support pillar 40 is guided by the tapered surface T to be led to the center portion 21C (see FIG. 2). In view of this, the support pillar 40 is disposed at the center portion 21C of the hole portion 21, thus the electronic device main body 1 and the second board 20 are relatively positioned with accuracy.

On the other hand, in the case where the reflow is performed with the support pillar 40 being at a position off of the center portion 21C viewing from the Y-direction, when the cream solder CS is disposed so as to have a uniform surface in the hole portion 21, the support pillar 40 is centered and led to the center portion 21C (see FIG. 2) by the effect of the surface tension of the solder S melted in the reflow. This causes the support pillar 40 to be in a state of being disposed on the center portion 21C of the hole portion 21, thus the electronic device main body 1 and the second board 20 are relatively positioned with accuracy.

Especially in the case where all the distances from the above-described distal ends 43 of the four support pillars 40 to the bottom portions of the respective corresponding hole portions 21 are not identical, when the support pillar 40 having the shortest distance abuts on the bottom portion of the hole portion 21, the other support pillars 40 cannot be inserted deeper, thus the distal ends 43 cannot be abutted on and guided by the tapered surface T. However, even the other support pillars 40 in such states can be centered and disposed on the center portions 21C of the hole portions 21 by the above-described effect of the surface tension of the melted solder, not by the guiding effect of the tapered surface T.

Since the cream solder CS applied over the hole portion 21 includes remaining flux and water vapor, the cream solder CS generates a void inside when heated by the reflow. Such void remaining inside the solder causes a formation of a blowhole in the solder S. However, since the hole portion 21 is foil led to include the tapered surface T and to gradually increase the diameter from the bottom portion (an end portion on the −Y-side) to the front surface 20a of the second board 20, a clearance is formed between the hole portion 21 and the support pillar 40. In view of this, even when the void is generated in the cream solder CS inside the hole portion 21, the void is discharged via this clearance to restrict the formation of the blowhole, thus ensuring bonding strength. Furthermore, the hole portion 21 includes the first metal film M1 over the whole internal surface. Therefore, in the reflow process, the melted solder S flows into the clearance between the support pillar 40 and the hole portion 21 along the surface of the first metal film M1, and the solder S is gaplessly filled into the hole portion 21. With this, the bonding strength between the support pillar 40 and the second board 20 is sufficiently ensured.

Therefore, according to the configuration of the embodiment, in addition to the above-described effect of the manufacturing cost reduction, the electronic device main body 1 and the second board 20 are relatively positioned with accuracy and the bonding strength between the support pillar 40 and the hole portion 21 is ensured, thereby ensuring providing the electronic device of high quality.

First and Second Modification

Figure 4A:
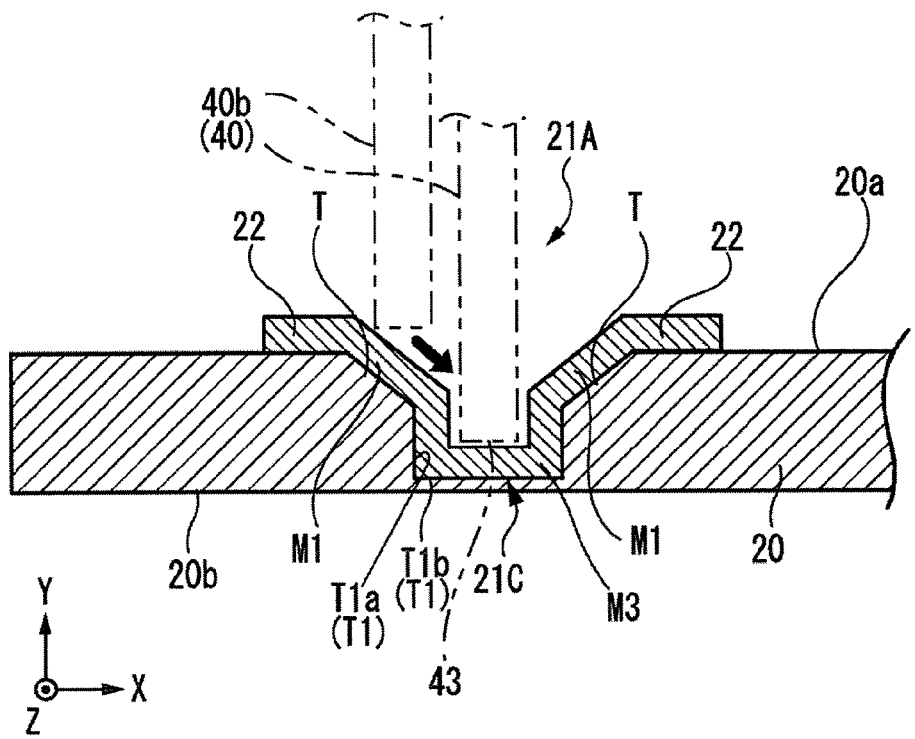
FIG. 4A is a cross-sectional view illustrating a configuration of a hole portion according to a first modification.
Figure 4B:
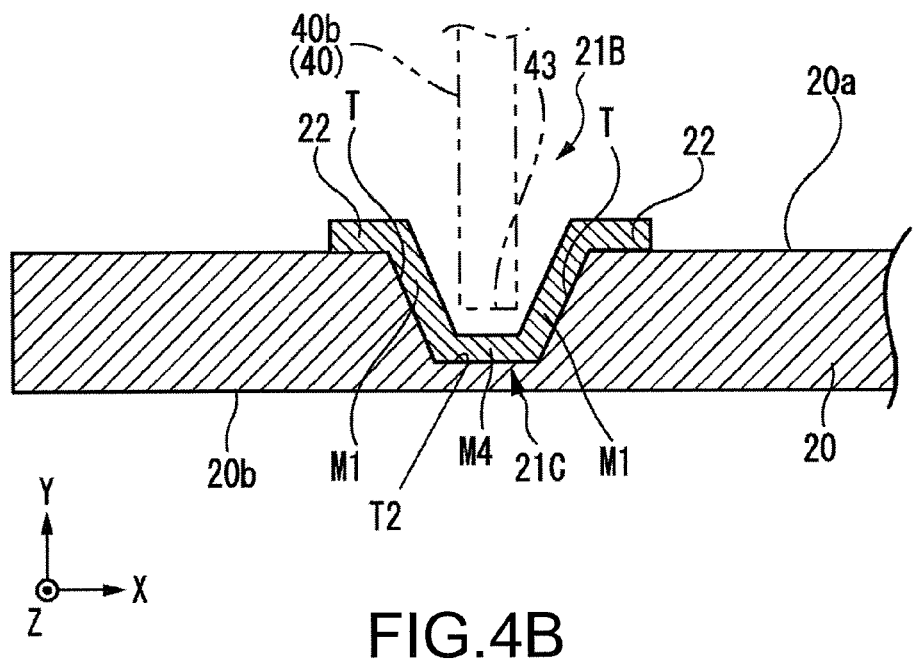
FIG. 4B is a cross-sectional view illustrating a configuration of the hole portion according to a second modification.

The following describes configurations of the modifications according to the hole portion 21 of the second board 20 in the electronic device 100 of the first embodiment described above. In the following description, a component that is identical or equal to that of the above-described embodiment is indicated by the identical reference numeral, and the description thereof is omitted or simplified. FIG. 4A and FIG. 4B illustrate modifications of the configuration of the hole portion 21. FIG. 4A illustrates a hole portion 21A according to a first modification, and FIG. 4B illustrates a hole portion 21B according to a second modification.

As illustrated in FIG. 4A, the hole portion 21A according to the first modification includes the tapered surface T and a closed-bottom cylinder shaped surface T1 that further extends in the −Y-side from the end portion of the tapered surface T on the −Y-side. The closed-bottom cylinder shaped surface T1 is formed such that the distal end 43 of the inserted support pillar 40 (40b) is fitted in. A side surface (an inner peripheral surface) T1a and a bottom surface T1b of the closed-bottom cylinder shaped surface T1 include a metal film M3 that has a configuration identical to the first metal film M1 and is integrally formed with the first metal film M1. Thus, the hole portion 21A includes the metal films M1 and M3 over the whole internal surface. With such configuration of the hole portion 21A, not only the effect similar to the above-described hole portion 21 is provided, but also fitting the distal end 43 of the support pillar 40 into the closed-bottom cylinder shaped surface T1 enables the support pillar 40 to be solder bonded in a state where a relative movement of the support pillar 40 in the X-direction and the Z-direction with respect to the closed-bottom cylinder shaped surface T1 is restricted.

As illustrated in FIG. 4B, the hole portion 21B according to the second modification includes a bottom surface T2 approximately parallel with the XZ-plane. The bottom surface T2 is formed such that the inserted distal end 43 of the support pillar 40 can abut on the bottom surface T2. The bottom surface T2 includes a metal film M4 that has a configuration identical to the first metal film M1 and is integrally formed with the first metal film M1. With such configuration of the hole portion 21B, a depth (a distance in the Y-direction) can be set to be short compared with that of the hole portion 21A according to the first modification.

Furthermore, while all the hole portions 21 and similar portion of the second board 20 described above have the configurations of the non-through holes, the hole portions of the second board 20 may include the tapered surfaces T inclining from the surface on the side where the support pillars 40 are inserted and have configurations of the through holes that pass through the second board 20 in the Y-direction.

Second Embodiment

Figure 5:
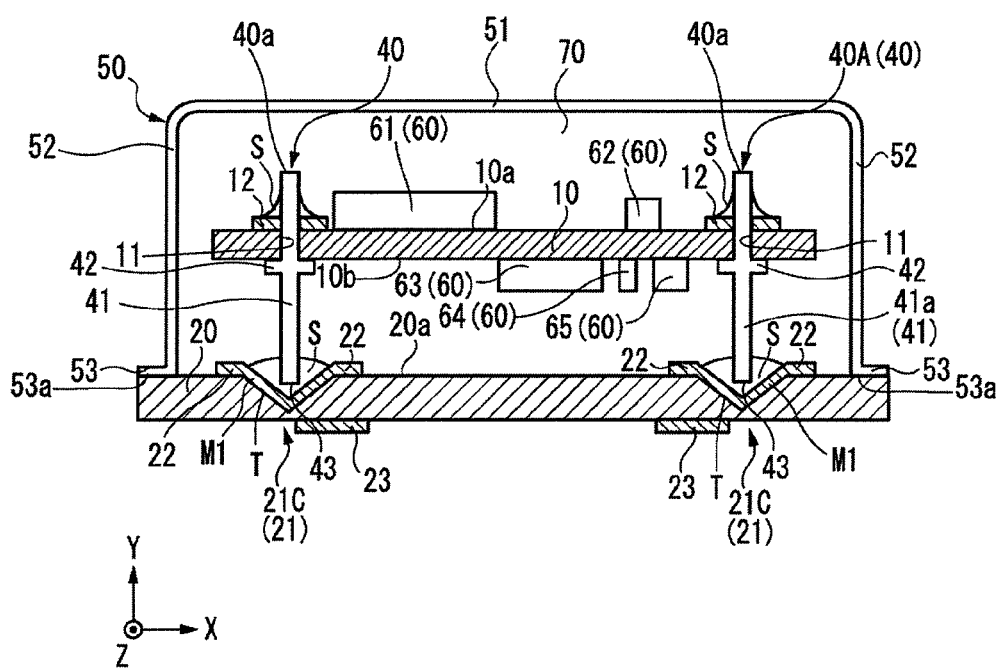
FIG. 5 is a cross-sectional view illustrating an exemplary electronic device according to a second embodiment.

Subsequently, a second embodiment will be described with reference to FIG. 5. FIG. 5 is a cross-sectional view illustrating an example of an electronic device 200 according to the second embodiment. In the following description, a component that is identical or equal to that of the first embodiment is indicated by the identical reference numeral, and the description thereof is omitted or simplified. As illustrated in FIG. 5, the electronic device 200 includes the first board 10, the second board 20, the support pillars 40, and the cover 50.

The electronic device 200 according to this embodiment has a configuration different from the above-described electronic device 100 in the point that the electronic device 200 does not include the third board 30. In the electronic device 200, the first board 10 is held separated from the second board 20 with the support pillars 40 raised from the front surface 20a of the second board 20. The bonding surface 53a of the cover 50 is bonded on the edge portion of the front surface 20a of the second board 20. The support pillar 40 has a configuration similar to the first embodiment, except that the length of the shaft portion 41 is formed to be short. This makes the electronic device 200 have a low profile configuration compared with the above-described electronic device 100. Even such electronic device 200 has the effect similar to the electronic device 100 according to the above-described first embodiment.

The electronic device 200 according to this embodiment may be formed by a process in which the support pillars 40 and the first board 10 are bonded first, and then the distal ends 43 of the support pillars 40 are inserted into the hole portions 21 of the second board 20 and bonded. The electronic device 200 may be formed by a process in which the distal ends 43 of the support pillars 40 are inserted into the hole portions 21 and bonded to the second board 20 first, and then the distal end portions of the support pillars 40 on the +Y-side is bonded to the first board 10. In this case, the support pillars 40 inserted into the hole portions 21 of the second board 20 are disposed in the center portions 21C of the respective hole portions 21 and accurately disposed with predetermined intervals with one another. Therefore, an operation to insert these support pillars 40 through the hole portions 11 of the first board 10 can be easily and reliably performed.

Third Embodiment

Figure 6A:
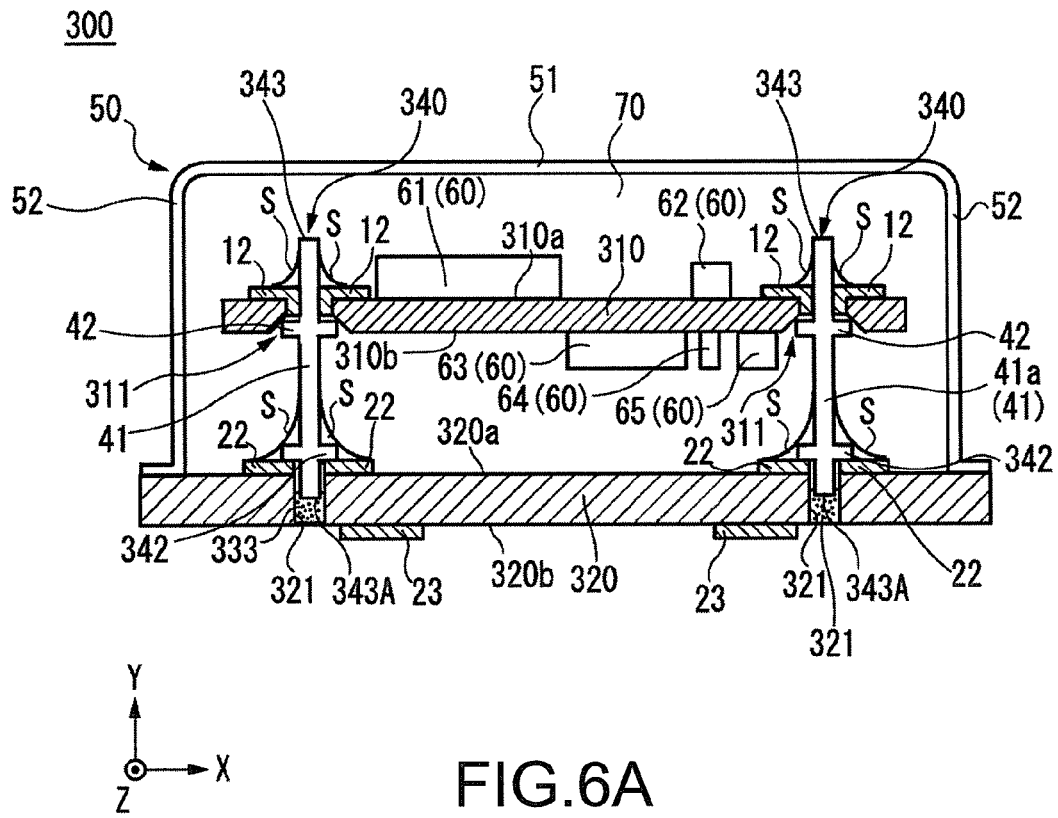
FIG. 6A and FIG. 6B illustrate an exemplary electronic device according to a third embodiment.
Figure 6B:
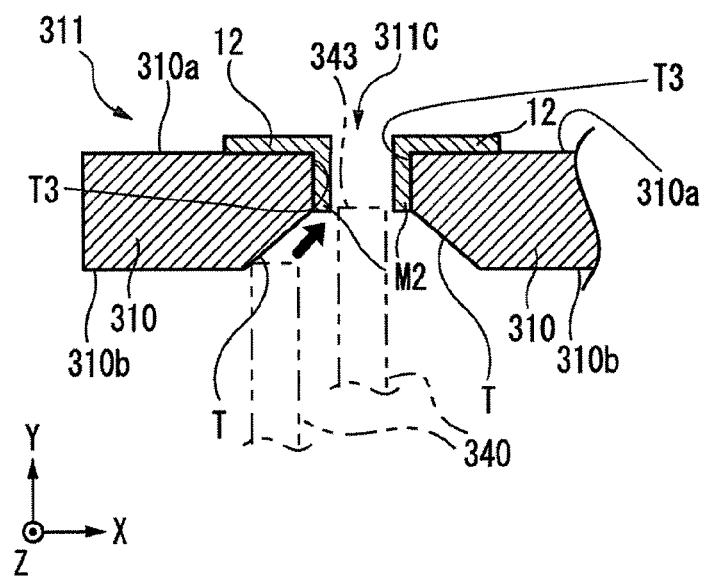

Subsequently, a third embodiment will be described with reference to FIG. 6A and FIG. 6B. FIG. 6A and FIG. 6B illustrate an example of an electronic device 300 according to the third embodiment. FIG. 6A is a cross-sectional view. FIG. 6B is a cross-sectional view of a main part in FIG. 6A and illustrates a part including a hole portion 311 on the −X-side and +Z-side. In the following description, a component that is identical or equal to that of the first and the second embodiments is indicated by the identical reference numeral, and the description thereof is omitted or simplified. As illustrated in FIG. 6A, the electronic device 300 includes a first board 310, a second board 320, support pillars 340, and the cover 50. The electronic device 300 has a configuration identical to the electronic device 200 according to the above-described second embodiment, except for the configurations of the hole portions 311 of the first board 310, hole portions 321 of the second board 320, and the support pillars 340.

The first board 310 includes, for example, four hole portions 311, similar to the hole portions 11 in the above-described first embodiment. The hole portion 311 on the −X-side and +Z-side among these hole portions 311 will be described, and the same applies to the other three hole portions 311.

As illustrated in FIG. 6B, the hole portion 311 has the configuration of the through hole passing through the first board 310 in the Y-direction and includes the tapered surface T and a cylindrical surface T3. The tapered surface T is configured to be an inclined surface inclining from a back surface (a surface on the −Y-side) 310b on a side of the second board 320 toward a center portion 311C of the hole portion 311. The cylindrical surface T3 communicates with the tapered surface T. The cylindrical surface T3 is formed up to a front surface (a surface on the +Y-side) 310a of the first board 310 so as to further extend in the +Y-direction from an end portion of the tapered surface T on the +Y-side. The hole portion 311 is formed such that the support pillar 340 is insertable. A distal end 343 of the support pillar 340 on the +Y-side is inserted from a side of the back surface 310b of the first board 310.

The cylindrical surface T3 includes a second metal film M2. The second metal film M2 has a configuration of the metal film similar to that of the above-described connection electrode 12 of the first board 310. The second metal film M2 is formed integrally with the connection electrode 12, for example, after the hole portion 311 is formed in the first board 310.

The second board 320 includes, for example, four hole portions 321, similar to the hole portions 21 of the second board 20 in the above-described first embodiment. These hole portions 321 have the configuration of a cylindrical through hole passing through the second board 320 in the thickness direction (the Y-direction). In the hole portion 311, a distal end 343A of the support pillar 340 on the −Y-side is inserted from a side of a front surface (a surface on the +Y-side) 320a of the second board 320.

Referring again to FIG. 6A, while the support pillar 340 has a configuration similar to the above-described support pillar 40 in the first embodiment, the support pillar 340 includes a flange portion 342 on a side surface at a position separated from the flange portion 42 by a predetermined distance in the −Y-direction. This flange portion 342 is a part that serves as a stopper locked by the front surface 320a of the second board 320 when the distal end 343A on the −Y-side of the support pillar 340 is inserted into the hole portion 321. The flange portion 342 has a configuration similar to the flange portion 42 disposed on the +Y-side.

The support pillar 340 is bonded to the second board 320 via the solder S from the front surface 320a side of the second board 320 in a state where the distal end 343A on the −Y-side is inserted into the hole portion 321. In the hole portion 321 after the support pillar 340 is bonded, a sealing material 333 having the non-conductive property is filled from a side of a back surface 320b of the second board 320.

Next, an exemplary manufacturing process for the electronic device 300 will be described. First, the support pillars 340 are bonded to the hole portions 321 of the second board 320. This arranges the support pillars 340 so as to extend from the front surface 320a of the second board 320 toward the +Y-direction. Next, the first board 310 and the second board 320 are positioned with one another. With this positioning, the first board 310 and the second board 320 are arranged in a state where the back surface 310b of the first board 310 and the front surface 320a of the second board 320 are facing and the distal ends 343 of the support pillars 340 on the +Y-side are arranged so as to be included in the opening regions of the hole portions 321 into which the distal ends 343 are inserted viewing from the Y-direction.

Subsequently, in a state thus positioned, the first board 310 and the second board 320 are brought close to one another in the Y-direction to insert the support pillars 340 into the hole portions 311 from the back surface 310b side of the first board 310, and furthermore, the support pillars 340 are made project from the front surface 310a of the first board 310. In this respect, the first board 310 and the second board 320 may be brought close to one another by using a weight of one of the first board 310 or the second board 320 that is placed above the other, or one of the first board 310 or the second board 320 may be pressed against the other. In this respect, the support pillars 340 may be pushed into the hole portions 311 until the flange portions 342 are locked by the back surface 310b of the first board 310.

As described above, the diameter of the hole portion 311 are set to be larger in the back surface 310b side than in an internal side of the first board 310. That is, the opening region of the hole portion 311 viewed from the Y-direction is formed to be larger than the opening region of the center portion 311C of the hole portion 311. In view of this, even in the case where the distal end 343 of the support pillar 340 raised from the second board 320 is off of the center portion 311C of the hole portion 311 viewing from the Y-direction when the first board 310 and the second board 320 are positioned with one another, the distal end 343 can be inserted into the hole portion 311 as it is without a need for the fine adjustment of the position of the distal end 343 when the distal end 343 is included within the opening region of the back surface 310b. Accordingly, such configuration of the hole portion 311 facilitates the operation of inserting the distal end 343 into the hole portion 311, and eventually it is possible to automate such inserting operation by using a machine, such as a chip mounter. Thus, the manufacturing cost of the electronic device 100 can be reduced.

Even in the case where the distal end 343 of the support pillar 340 is at a position off of the center portion 311C of the hole portion 311 viewing from the Y-direction when the support pillar 340 is inserted into the hole portion 311, further simply pushing the support pillar 340 inward of the hole portion 311 leads the distal end 343 of the support pillar 340 to the center portion 311C guided by the tapered surface T (see FIG. 6B). With this, the support pillar 340 is brought into a state of being disposed passing through the center portion 311C of the hole portion 311, thus the first board 310 and the second board 320 are relatively positioned with accuracy.

Furthermore, the second metal film M2 is formed in the hole portion 311. Therefore, in the reflow process, the melted solder S flowing into the clearance between the support pillar 340 and the cylindrical surface T3 along the surface of the second metal film M2 ensures the bonding strength by the solder S between the support pillar 340 and the first board 310.

As described above, with the configuration of the electronic device 300 according to this embodiment, the manufacturing process for the electronic device is facilitated, thus ensuring the reduced manufacturing cost of the electronic device. The first board 310 and the second board 320 are relatively positioned with accuracy. This ensures accuracy of an outside dimension and can provide the electronic device with high quality that ensures the bonding strength.

Third Modification

Figure 7:
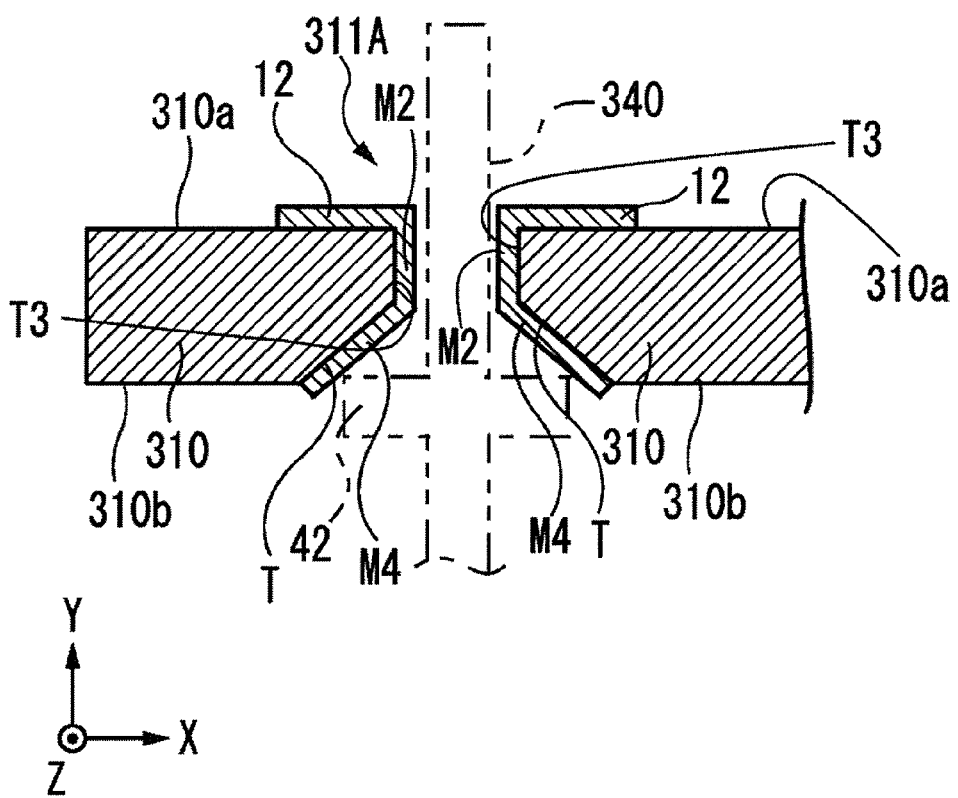
FIG. 7 is a cross-sectional view illustrating a configuration of the hole portion according to a third modification.

The following describes a configuration of a third modification according to the hole portion 311 of the first board 310 in the electronic device 300 in the above-described third embodiment. In the following description, a component that is identical or equal to that of the above-described embodiments is indicated by the identical reference numeral, and the description thereof is omitted or simplified. FIG. 7 is a cross-sectional view illustrating a configuration of a hole portion 311A according to the third modification.

As illustrated in FIG. 7, the hole portion 311A according to the third modification has the configuration identical to the above-described hole portion 311, and in addition, a metal film M4 is formed on the tapered surface T. This metal film M4 has a configuration of a metal film similar to the second metal film M2. The metal film M4 is formed using the method similar to the film formation method of the second metal film M2 after the tapered surface T is formed in the first board 310.

With such configuration of the hole portion 311A, in addition to the effect similar to the above-described hole portion 311, in the reflow, the melted solder S is arranged so as to flow to the metal film M4 along the surface of the second metal film M2 and fill the clearance between the tapered surface T and the support pillar 340. In view of this, the bonding strength between the support pillar 340 and the first board 310 by the solder can be enhanced compared with the configuration of the above-described hole portion 311. Accordingly, the electronic device of much higher quality can be provided.

Fourth Embodiment

Figure 8:
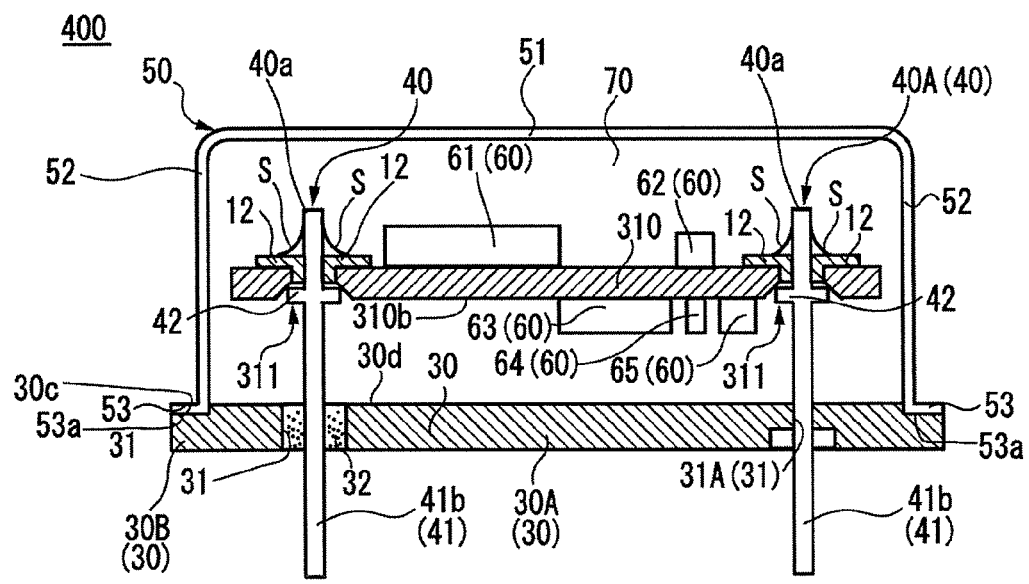
FIG. 8 is a cross-sectional view illustrating an exemplary electronic device according to a fourth embodiment.

Subsequently, a fourth embodiment will be described with reference to FIG. 8. FIG. 8 is a cross-sectional view illustrating an example of an electronic device 400 according to the fourth embodiment. In the following description, a component that is identical or equal to that of the above-described embodiments is indicated by the identical reference numeral, and the description thereof is omitted or simplified. As illustrated in FIG. 8, the electronic device 400 includes the first board 310, the third board 30, the support pillars 40, and the cover 50. The electronic device 400 is configured similarly to the above-described electronic device main body 1 except for the configuration of the hole portion 311 in the first board 310. The electronic device 400 has a configuration of a so-called pin type device. In the electronic device 400, portions of the support pillars 40 extending from the third board 30 in the −Y-direction are leads for external connection.

The electronic device 400 is manufactured by, for example, the following process. The electronic device 400 is manufactured as follows. First, the support pillars 40 are bonded to the third board 30, and subsequently, the distal ends 40a of the support pillars 40 on the +Y-side are inserted into the hole portions 311 from the back surface 310b side of the first board 310 and the solder bonding is performed in this state.

Figure 9:
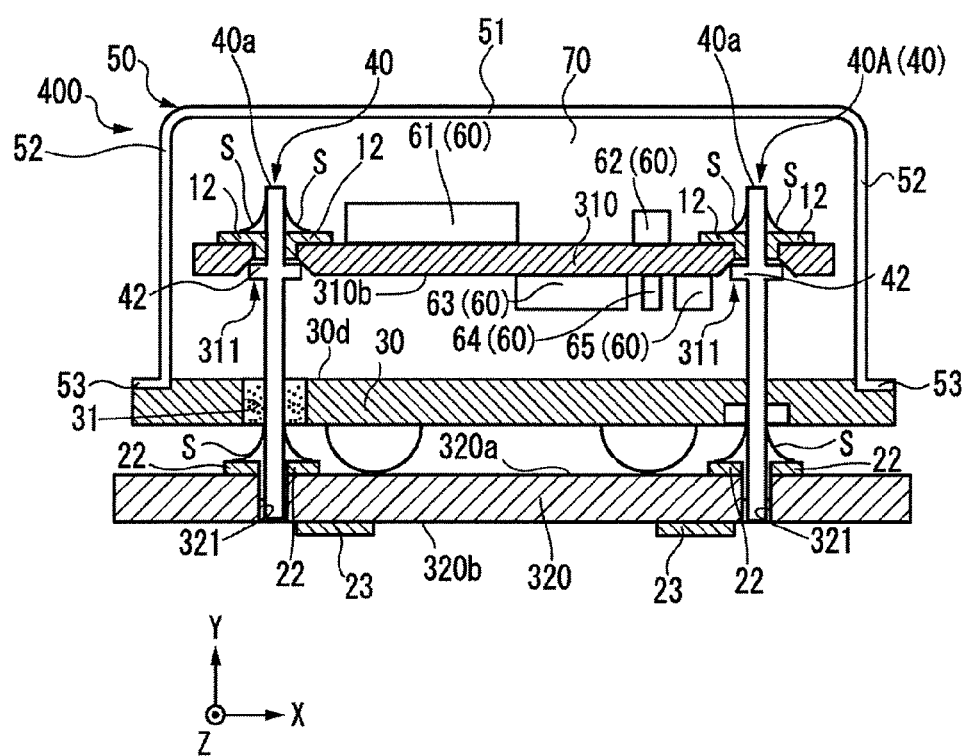
FIG. 9 is a cross-sectional view illustrating another exemplary electronic device according to the fourth embodiment.

FIG. 9 is a cross-sectional view illustrating another example of the electronic device 400 according to the fourth embodiment. While the electronic device 400 is the pin type device as described above, the electronic device 400 may be a surface mount device type by bonding the second board 320 on the −Y-side of the electronic device 400 as illustrated in FIG. 9. In this configuration, the distal ends of the lead portions 41b of the electronic device 400 are inserted into the hole portions 321 of the second board 20. The lead portions 41b have portions projecting to the −Y-side from the hole portion 321 of the second board 320 cut off.

The embodiments have been described above. However, this disclosure is not limited to the above-described embodiments, and various changes of the embodiments may be made without departing from the spirit and scope of the disclosure. For example, a part of the configurations of the above-described embodiments or modifications may be replaced with the configurations of other embodiments or modifications, and may be combined with the configurations of the above-described embodiments or modifications. For example, the electronic device in the second embodiment may employ the configuration of the first modification or the second modification as the hole portion. The electronic device in the fourth embodiment may employ the configuration of the third modification as the hole portion. While in the above-described embodiments, the description has been made using the oven controlled crystal oscillator as an example of the electronic device 100 and similar device, the electronic device 100 and similar device are not limited to the oven controlled crystal oscillator but may be other kinds of electronic devices, such as a temperature compensation type crystal controlled oscillator (TCXO) and a voltage controlled crystal oscillator (VCXO).

This disclosure provides an electronic device that includes at least two boards having hole portions. The boards are held mutually separated in a state where support pillars are inserted into the hole portions. The hole portions include tapered surfaces that incline toward center portions of the hole portions from a surface on a side from which the support pillars of the boards are inserted.

In this disclosure, the at least two boards may include a first board for mounting an electronic component and a second board mounted on a printed board, and the hole portions may be non-through holes and include the tapered surfaces that incline from a surface of the second board at a side of the first board. Furthermore, the hole portion may include a first metal film over a whole internal surface including the tapered surface.

The at least two boards may include at least any one of a second board bonded to a printed board and a third board through which the support pillars pass and a first board held with the support pillars raised from the at least any one of the second board and the third board. The first board is for mounting an electronic component. The hole portions may be through holes that pass through the first board and include tapered surfaces that incline from a surface at a side of the at least any one of the second board and the third board. Furthermore, the support pillars are inserted in the hole portions and the hole portions include cylindrical surfaces that communicate with the tapered surfaces, and the cylindrical surfaces may be formed with second metal films.

With this disclosure, the support pillars are easily insertable into the hole portions, and the boards are accurately positionable with one another. In view of this, while ensuring accuracy of an outside dimension of the electronic device, the manufacturing cost can be reduced. Thus, the electronic device with an excellent quality and low in price can be provided.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal oscillator, comprising: a first board, being for mounting an electronic component, and the first board including at least one first hole portion; a second board being mounted on a printed board, and the second board including at least one second hole portion; and at least one support pillar, being inserted into the first hole portion and being disposed in the second hole portion such that the first board and the second board are held mutually separated, wherein the second hole portion is non-through hole and including a tapered surface, and the tapered surface inclines symmetrically toward a center portion of the second hole portion from a surface of the second board; a first metal film attached over the tapered surface and electrically connected to the at least one support pillar.

2. A crystal oscillator, comprising:
   a first board, being for mounting an electronic component, and the first board including at least one first hole portion; and
   at least any one of a second board bonded to a printed board and a third board through which at least one support pillar passes;

the first board held with the support pillar raised from the at least any one of the second board and the third board, wherein the first hole portion is through hole that passes through the first board and includes a tapered surface that inclines symmetrically toward a center portion of the first hole portion from a surface of the first board, which faces at least any one of the second board and the third board, the support pillar is inserted in the first hole portion, and the first hole portion includes a cylindrical surface that communicates with the tapered surface, and a second metal film attached over the cylindrical surface and the tapered surface and electrically connected to is formed with the at least one support pillar.

* * * * *